(12) United States Patent  
Noda

(10) Patent No.: US 8,220,787 B2  
(45) Date of Patent: Jul. 17, 2012

(54) PART MOUNTING DEVICE

(75) Inventor: Kazuhiko Noda, Fukuoka (JP)

(73) Assignee: Panasonic Corporation, Osaka (JP)

( * ) Notice: Subject to any disclaimer, the term of this patent is extended or adjusted under 35 U.S.C. 154(b) by 496 days.

(21) Appl. No.: 12/557,088

(22) Filed: Sep. 10, 2009

(65) Prior Publication Data

US 2010/0074722 A1    Mar. 25, 2010

(51) Int. Cl.  
   *B25B 11/00* (2006.01)
(52) U.S. Cl. .............................. 269/21; 269/20; 269/291
(58) Field of Classification Search .................... 269/21, 269/20, 291, 309, 310; 29/281.1, 705  
See application file for complete search history.

(56) References Cited

U.S. PATENT DOCUMENTS

| 4,741,078 A | * | 5/1988 | Kimura | .............................. 29/39 |
| 5,206,984 A | * | 5/1993 | Matumoto et al. | .............. 29/705 |
| 5,515,599 A | * | 5/1996 | Best | .............................. 29/705 |
| 6,435,941 B1 | * | 8/2002 | White | .............................. 451/5 |
| 6,845,974 B2 | * | 1/2005 | Bidaud | ........................... 269/91 |

FOREIGN PATENT DOCUMENTS

JP    2006-093321 A    4/2006

\* cited by examiner

*Primary Examiner* — Basil Katcheves  
(74) *Attorney, Agent, or Firm* — Pearne & Gordon LLP

(57) ABSTRACT

A part mounting apparatus of the invention comprises: a pickup head having a pickup tool for picking up a part; a pickup head supporting unit for supporting the pickup head; a pickup head supporting arm having one end portion where the pickup head is disposed and an other end portion rotatably mounted to the pickup head supporting unit; a pickup head inverting unit for vertically inverting the pickup head with respect to the pickup head supporting unit; and a pickup tool rotating unit for rotating the pickup tool about a rotational axis of the pickup tool, wherein the pickup tool rotating unit includes driving force generating unit and driving force transmitting unit for transmitting a driving force of the driving force generating unit as a rotational force of the pickup tool, and the driving force generating unit is disposed on the pickup head supporting unit.

4 Claims, 6 Drawing Sheets

PART MOUNTING DEVICE

BACKGROUND OF THE INVENTION

1. Field of the Invention

The present invention relates to a part mounting apparatus for mounting parts such as dice obtained by discretizing a silicon wafer by dicing.

2. Description of the Related Art

A die bonding apparatus has three operational stages including a part supplying stage for supplying a die (part) obtained by discretizing a thinned silicon wafer by dicing; a intermediate stage for temporarily placing the die picked up by a pickup head so as to deliver the die from the part supplying stage to a mounting head; and a mounting stage for bonding the die onto a substrate by the mounting head. The pickup head has a suction nozzle whose orientation is vertically invertable so that the orientation of the face (circuit forming surface) of the picked-up die can be changed. Further, the suction nozzle is rotatable about its central axis so as to effect angular correction (refer to patent document 1).
Patent Document 1: JP-A-2006-93321

In the conventional pickup head, since a mechanism for rotating the suction nozzle about its central axis and its driving source are disposed on an inverting portion which is inverted together with the suction nozzle, the inverting portion has been large in size and heavyweight, resulting in the deterioration of its dynamic characteristics and an increase in the dead space. In addition, the wiring for electrical power supply to the driving source located at the inverting portion has been complex.

SUMMARY OF THE INVENTION

Accordingly, an object of the invention is to provide a part mounting apparatus for eliminating the complex wiring of the pickup head and realizes a compact and lightweight inverting portion.

A part mounting apparatus according to a first aspect of the invention comprises: a pickup head having a pickup tool for picking up a part; a pickup head supporting unit for supporting the pickup head; a pickup head supporting arm having one end portion where the pickup head is disposed and an other end portion rotatably mounted to the pickup head supporting unit; a pickup head inverting unit for vertically inverting the pickup head with respect to the pickup head supporting unit; and a pickup tool rotating unit for rotating the pickup tool about a rotational axis of the pickup tool, wherein the pickup tool rotating unit includes driving force generating unit and driving force transmitting unit for transmitting a driving force of the driving force generating unit as a rotational force of the pickup tool, and the driving force generating unit is disposed on the pickup head supporting unit.

According to a second aspect of the invention, the part mounting apparatus according to the first aspect of the invention further comprises a shaft disposed on the pickup head supporting arm so as to be movable in a direction of the rotational axis, both end portions of the shaft respectively projecting from the both end portions of the pickup head supporting arm; wherein the driving force generating unit imparts a force for moving in the direction of the rotational axis of the pickup head supporting arm from one end portion of the shaft to the shaft; and the driving force transmitting unit converts the translatory movement of an other end portion of the shaft into rotary movement of the pickup tool.

According to a third aspect of the invention, the part mounting apparatus according to the first aspect of the invention, the driving force generating unit causes a driven member disposed at one end portion of the shaft to follow rotary movement of an eccentric cam disposed on the pickup head supporting unit so as to impart to the shaft a force for moving in the direction of the rotational axis of the pickup head supporting arm.

According to a fourth aspect of the invention, the part mounting apparatus according to the first aspect of the invention, the pickup tool has an engaged portion that is engaged with another end portion of the shaft; and the engaged portion is moved in conjunction with the translatory movement of the other end portion of the shaft such that the translatory movement of the other end portion of the shaft is converted into the rotary movement of the pickup tool.

According to a fifth aspect of the invention, the part mounting apparatus according to the first aspect of the invention further comprises: a mounting head receiving the part inverted in conjunction with the inversion of the pickup head and mounting the part onto a substrate, wherein the pickup head is supported by the pickup head supporting arm such that the pickup tool is located at a position remoter from the mounting head with respect to the rotational axis of the pickup head supporting arm when the pickup head is in a downwardly oriented attitude, and wherein the pickup tool rotating unit includes the driving force generating unit disposed on the pickup head supporting unit and the driving force transmitting unit disposed on the pickup head supporting arm and adapted to transmit the driving force of the driving force generating unit as the rotational force of the pickup tool.

According to a sixth aspect of the invention, the part mounting apparatus according to the first aspect of the invention mounting apparatus further comprising a part supplying stage; a intermediate stage temporarily placing the picked up part; a mounting head receiving the part inverted in conjunction with the inversion of the pickup head or a part placed temporarily without being inverted on the intermediate stage; and a mounting stage mounting onto a substrate the part received by the mounting head; wherein, when the mounting head receives the part placed temporarily on the intermediate stage without being inverted and mounts the part onto the substrate, the pickup head is disposed such that the rotational axis of the pickup head supporting arm is located at a position remoter from the intermediate stage with respect to the pickup tool, and wherein when the mounting head receives the part inverted in conjunction with the inversion of the pickup head and mounts the part onto the substrate, the pickup head is disposed such that the pickup tool assumes a position remoter from the mounting head with respect to the rotational axis of the pickup head supporting arm when the pickup head is in a downwardly oriented attitude.

The pickup tool rotating unit is constituted by the driving force generating unit and the driving force transmitting unit for transmitting the driving force of the driving force generating unit as a rotational force of the pickup tool, and the driving force generating unit whose weight is large is disposed on not the pickup head but the pickup head supporting unit. Therefore, the complex wiring for supplying electrical power to the pickup head is eliminated, and the dynamic characteristics and space efficiency improve due to the compact and lightweight pickup head.

The pickup tool rotating means is constituted by the driving force generating means and the driving force transmitting means for transmitting the driving force of the driving force generating means as a rotational force of the pickup tool, and the driving force generating means whose weight is large is disposed on not the pickup head but the pickup head supporting means. Therefore, the complex wiring for supplying electrical power to the pickup head is eliminated, and the dynamic characteristics and space efficiency improve due to the compact and lightweight pickup head.

The pickup tool rotating unit is constituted by the driving force generating unit and the driving force transmitting unit for transmitting the driving force of the driving force generating unit as a rotational force of the pickup tool, and the driving force generating unit whose weight is large is disposed on not the pickup head but the pickup head supporting unit. Therefore, the complex wiring for supplying electrical power to the pickup head is eliminated, and the dynamic characteristics and space efficiency improve due to the compact and lightweight pickup head.

DESCRIPTION OF THE PREFERRED EMBODIMENTS

Figure 1:
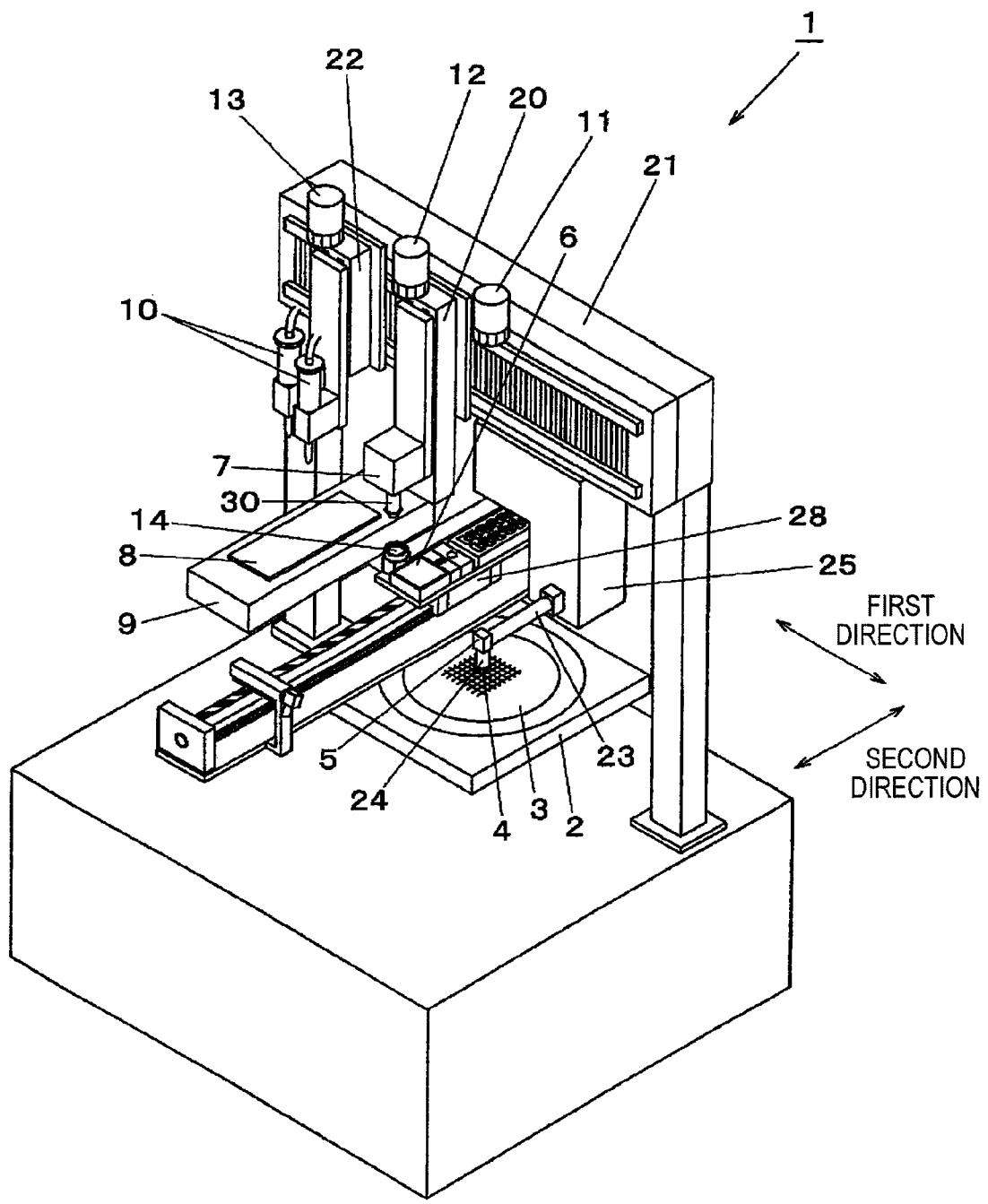
FIG. 1 is a perspective view of a part mounting apparatus in accordance with an embodiment of the invention.
Figure 2:
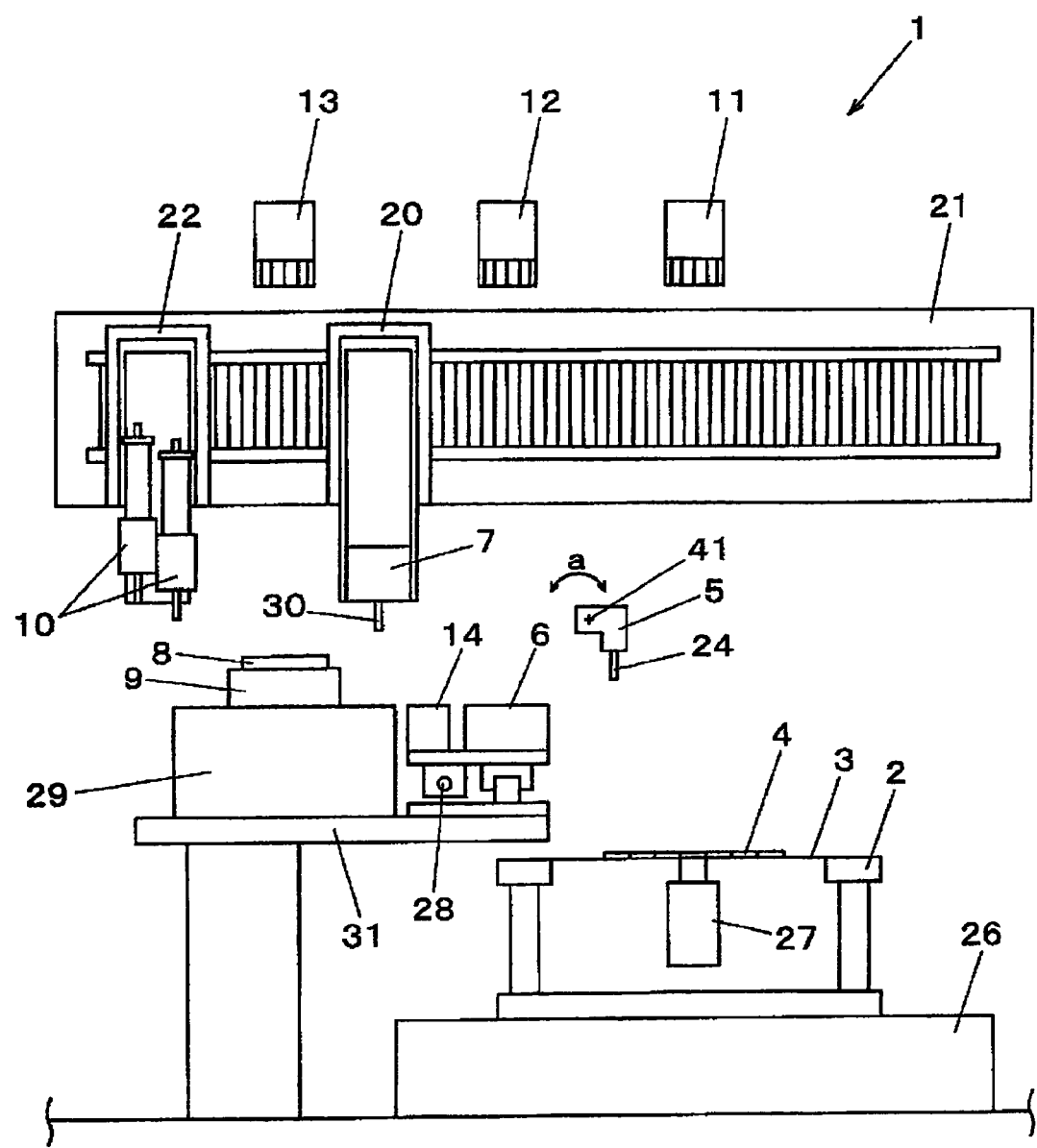
FIG. 2 is a schematic diagram of the part mounting apparatus in accordance with the embodiment of the invention.
Figure 3:
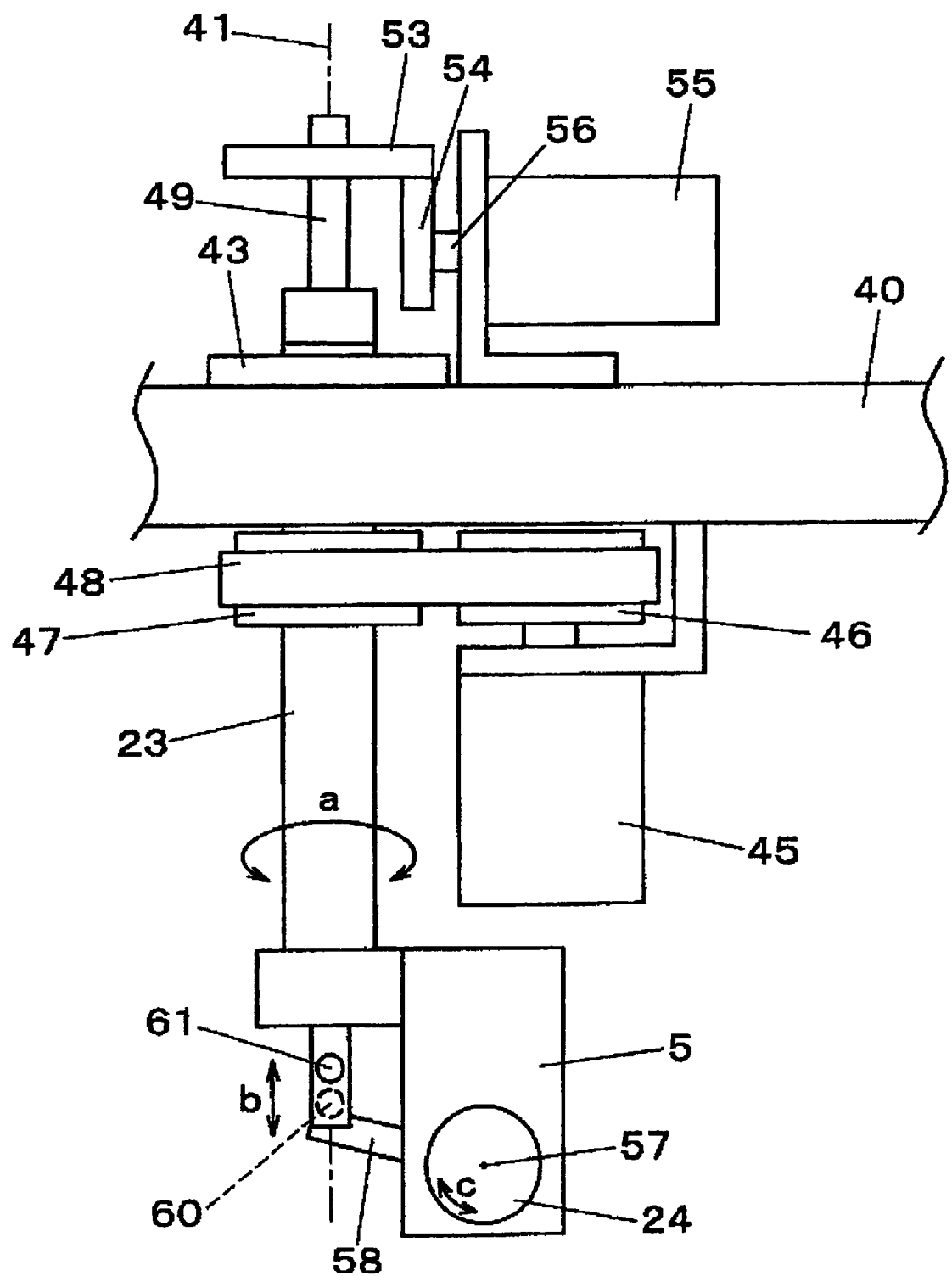
FIG. 3 is a schematic diagram of a driving mechanism of the part mounting apparatus in accordance with the embodiment of the invention.
Figure 4:
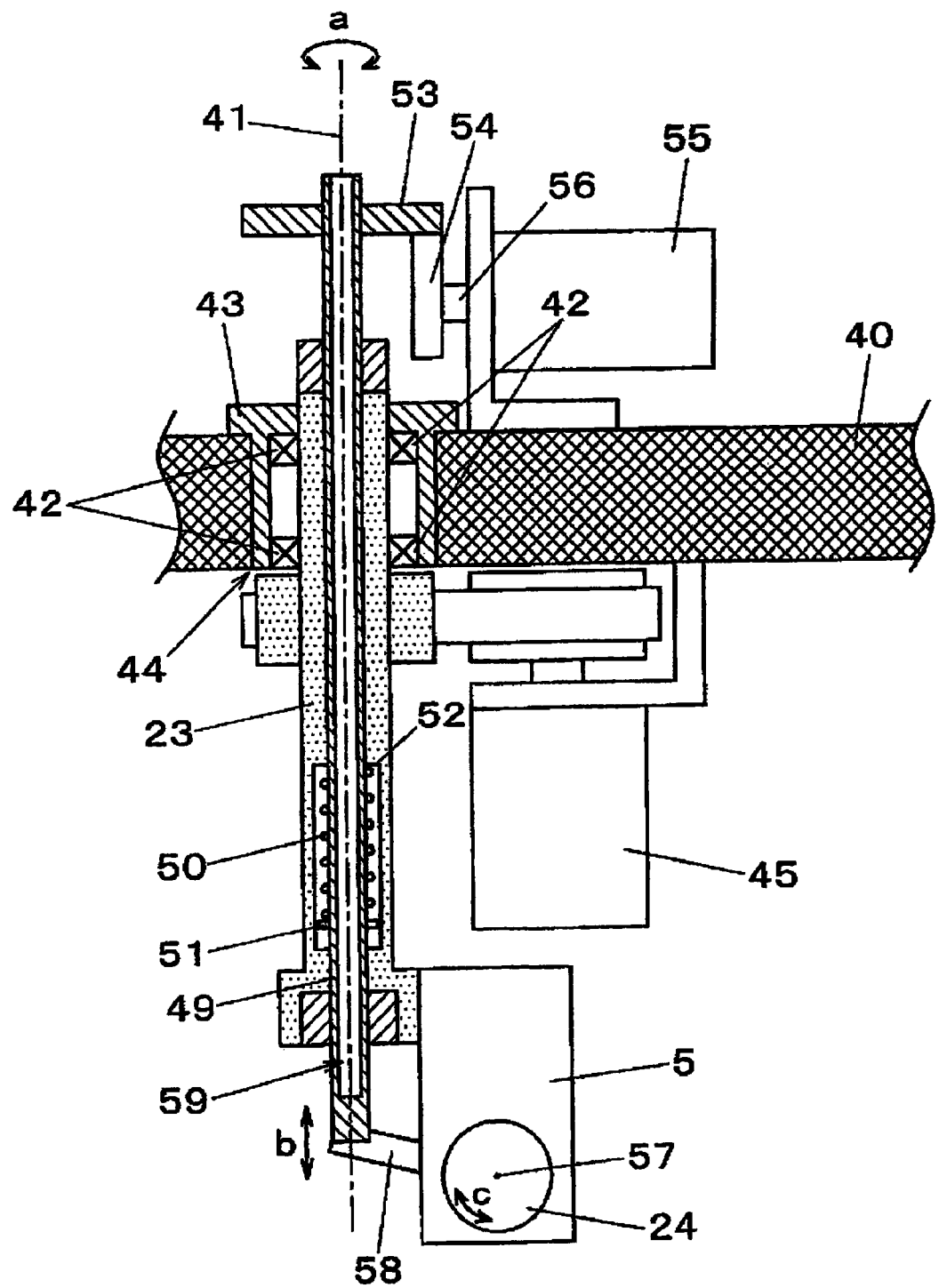
FIG. 4 is a cross-sectional view illustrating an internal structure of parts of the part mounting apparatus in accordance with the embodiment of the invention.
Figure 5:
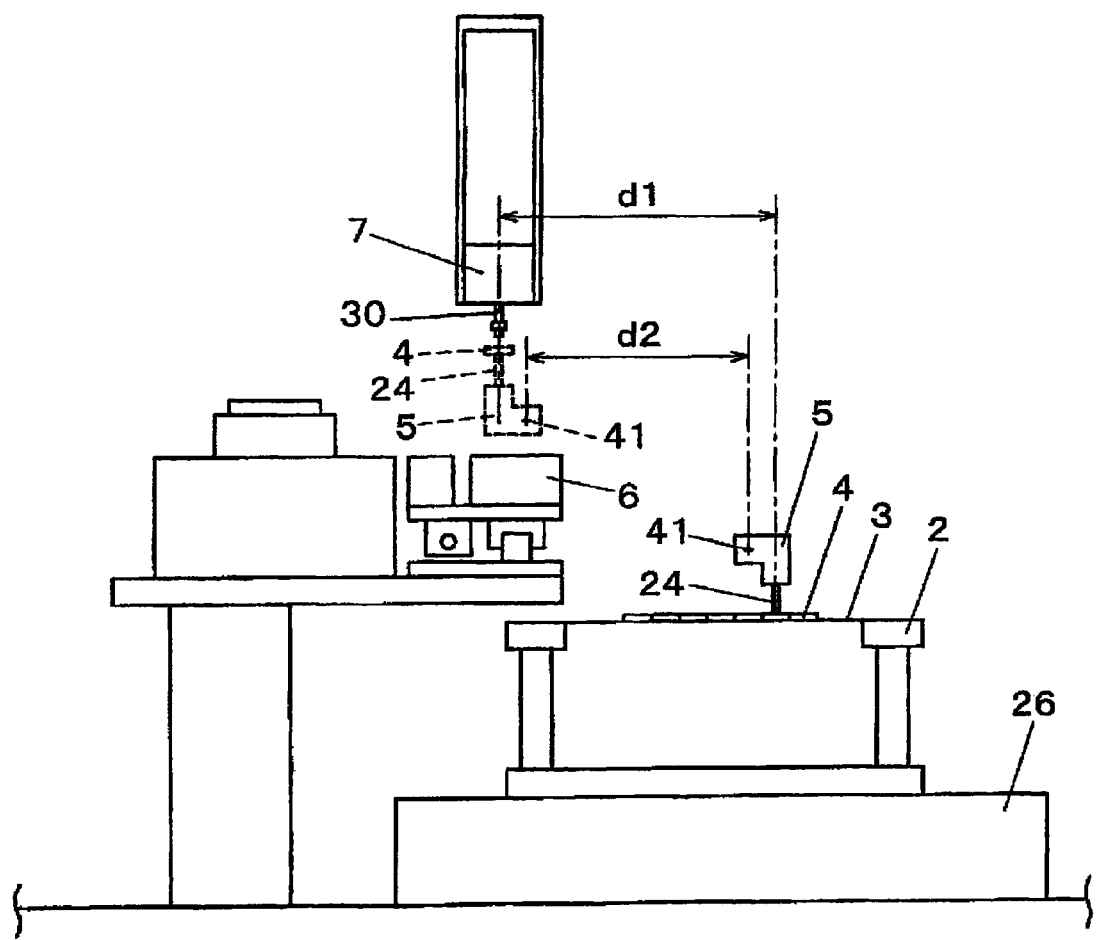
FIG. 5 is a diagram illustrating the positional relationship between a pickup head and a mounting head during face-down mounting of the part mounting apparatus in accordance with the embodiment of the invention.
Figure 6:
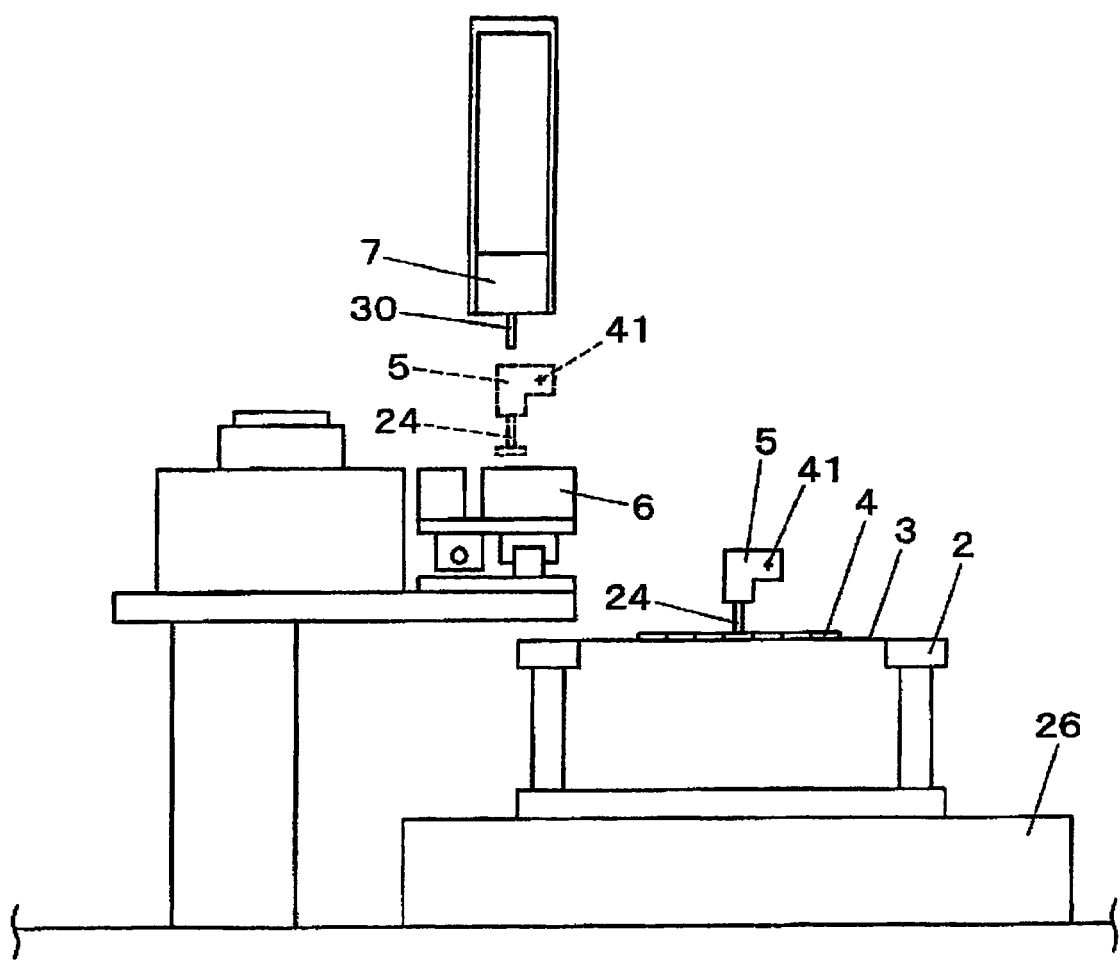
FIG. 6 is a diagram illustrating the positional relationship between the pickup head and the mounting head during face-up mounting of the part mounting apparatus in accordance with the embodiment of the invention.

A description will be given of an embodiment of the invention with reference to the drawings. FIG. 1 is a perspective view of a part mounting apparatus in accordance with an embodiment of the invention. FIG. 2 is a schematic diagram of the part mounting apparatus in accordance with the embodiment of the invention. FIG. 3 is a schematic diagram of a driving mechanism of the part mounting apparatus in accordance with the embodiment of the invention. FIG. 4 is a cross-sectional view illustrating an internal structure of parts of the part mounting apparatus in accordance with the embodiment of the invention. FIG. 5 is a diagram illustrating the positional relationship between a pickup head and a mounting head during face-down mounting of the part mounting apparatus in accordance with the embodiment of the invention. FIG. 6 is a diagram illustrating the positional relationship between the pickup head and the mounting head during face-up mounting of the part mounting apparatus in accordance with the embodiment of the invention.

First, referring to FIGS. 1 and 2, a description will be given of the overall configuration of the part mounting apparatus and its operation. A part mounting apparatus 1 is comprised of a wafer sheet holder 2; a pickup head 5 for picking up a chip 4 from a wafer sheet 3 held on the wafer sheet holder 2; a chip relay table 6 for temporarily placing the chip 4 picked up from the wafer sheet 3 by the pickup head 5; a mounting head 7 for receiving from the pickup head 5 or the intermediate table 6 the chip 4 picked up from the wafer sheet 3; a substrate supporting table 9 for supporting a substrate 8; a dispenser 10 for applying to the substrate 8 a paste adhesive for bonding the chip 4 thereto; a first camera 11 for confirming the position and orientation of the chip 4 adhered to the wafer sheet 3; a second camera 12 for confirming the position and orientation of the chip 4 placed temporarily on the intermediate table 6; a third camera 13 for confirming the position of application of the paste adhesive set on the substrate 8; and a fourth camera 14 for confirming the position and orientation of the chip 4 received by the mounting head 7. The first camera 11, the second camera 12, and the third camera 13 are respectively disposed vertically upwardly of the object to be imaged, and a vertically downward area is set as an imaging area. On the other hand, the fourth camera 14 is disposed vertically downwardly of the object to be imaged, and a vertically upward area is set as an imaging area.

The mounting head 7 is movable in a vertical direction and in a horizontal direction (first direction) by a first linearly moving unit 20 and a second linearly moving unit 21. The dispenser 10 is also movable in the vertical direction and in the horizontal direction (first direction) by a third linearly moving unit 22 and the second linearly moving unit 21. The pickup head 5 is mounted on a leading end of a rotating arm 23 extending in a second direction perpendicular to the first direction within a horizontal plane. The rotating arm 23 is rotatable about a central axis 41, and the pickup head 5 vertically inverted by this rotation so as to be able to change the orientation of a nozzle 24 so as to face upward or downward. The pickup head 5 together with the rotating arm 23 is mounted on a fourth linearly moving unit 25, and is movable in the vertical direction and in the horizontal directions (first direction and second direction).

The wafer sheet holder 2 is movable in the horizontal directions (first direction and second direction) at a predetermined height by a fifth linearly moving unit 26. An upthrusting unit 27 for the chip 4 is provided underneath the wafer sheet holder 2. The upthrusting unit 27 is disposed so as to assume a vertically upper or lower positional relationship with respect to the first camera 11. As the wafer sheet holder 2 horizontally moves with respect to the upthrusting unit 27, an arbitrary one of the chips 4 adhered to the wafer sheet is positioned vertically upwardly of the upthrusting unit 27. The chip 4 thrust upward by the upthrusting unit 27 is sucked by the nozzle 24 of the pickup head 5 and is thereby released from the wafer sheet 3.

The intermediate table 6 and the substrate supporting table 9 are movable in the second direction at a predetermined height by a sixth linearly moving unit 28 and a seventh linearly moving unit 29, respectively. As the dispenser 10 and the chip 4 sucked onto a nozzle 30 mounted to the mounting head 7 so as to face down are moved in the first direction, and the substrate 8 is moved in the second direction, the paste adhesive is applied to an arbitrary position on the substrate 8, and the chip 4 is mounted to that position. In a case where the chip 4 is mounted face up, the chip 4 picked up by the pickup head 5 is temporarily placed on the intermediate table 6 without being inverted, and this chip 4 is picked up by the mounting head 7 and is mounted to the substrate 8. On the other hand, in a case where the chip 4 is mounted face down, the pickup head 5 is vertically inverted, whereby the chip 4 picked up from the wafer sheet 3 in a face-up attitude is inverted and converted to a face-down attitude, and is then delivered directly to the mounting head 7.

Next, referring to FIG. 2, a description will be given of the arrangement of the wafer sheet holder 2, the intermediate table 6, and the substrate supporting table 9. The intermediate table 6 and the substrate supporting table 9 are arranged on a table 31 in parallel with each other in the first direction. The substrate supporting table 9 is disposed at a higher position than the intermediate table 6. The table 31 is supported on a machine base on the substrate supporting table 9 side, and a space is formed below the intermediate table 6. The wafer sheet holder 2 is disposed at a lower position than the table 31 on the intermediate table 6 side of the table 31. The space formed below the intermediate table 6 is a space into which, when the wafer sheet holder 2 positions an arbitrary one of the chips 4 vertically upwardly of the upthrusting unit 27, its portion can enter.

In the part mounting apparatus 1, in the case where one chip 4 is mounted face up to the substrate 8, the pickup head 5 moves between the wafer sheet 3 held on the wafer sheet holder 2 and the intermediate table 6 and places the chip 4 temporarily, and the mounting head 7 moves between the intermediate table 6 and the substrate 8 supported on the substrate supporting table 9 and mounts the chip 4. In the mounting method based on the cooperation between such plural heads, mounting is preferably effected at such timings that the mounting head 7 comes to pick up the chip 4 immediately after the temporary placement of the chip 4 by the pickup head 5, to ensure that unnecessary waiting time for movement will not occur in each head. For this reason, in the part mounting apparatus 1, a balance in the moving time between the pickup head 5 and the mounting head 7 is achieved by disposing the intermediate table 6 so as to be set at a height between the wafer sheet holder 2 and the substrate supporting table 9.

At what height the intermediate table 6 is specifically disposed is determined by taking into consideration the moving speed and the horizontal moving distance of the pickup head 5 and the mounting head 7 as well as the time required in the pickup and mounting. Since time is generally required for positioning, heating, and the like in the mounting of chips, it is frequently preferable to dispose the intermediate table 6 close to the substrate supporting table 9 in order to shorten the moving distance of the mounting head 7. By disposing the intermediate table 6 in this manner, it is possible to avoid the occurrence of situations where when the mounting head 7 came to pick up the chip 4, the chip 4 is not placed temporarily on the intermediate table 6 and where when the pickup head 5 came to temporarily place the chip 4, an earlier chip 4 still remains in the temporarily placed state. Thus production efficiency improves.

In the part mounting apparatus 1, since a space allowing the wafer sheet holder 2 enter below the table 31 is provided, the horizontal moving distance of the pickup head 5 can be shortened, so that the intermediate table 6 can be disposed closer to the substrate supporting table 9. In consequence, the moving distance of the mounting head 7 is also shortened, and the moving distances of the two heads 5 and 7 are shortened as a whole, so that the production efficiency improves further.

Next, referring to FIGS. 3 to 6, a description will be given of the part mounting device. The rotating arm 23 is mounted on a moving arm 40 in a state in which the rotating arm 23 projects in the second direction. The moving arm 40 is attached to the fourth linearly moving unit 25, and is moved in the vertical direction and the horizontal direction by the driving of the fourth linearly moving unit 25.

The rotating arm 23 has a hollow cylindrical shape having the axis 41 as its center, the pickup head 5 is mounted on its leading end portion, and a bearing portion 43 having a pair of bearings 42 disposed therein is mounted on its rear end portion. When the rotating arm 23 is fitted to the fourth linearly moving unit 25, the bearing portion 43 is inserted into a hole 44 formed in the moving arm 40. A first motor 45 serving as a rotatively driving source of the rotating arm 23 is mounted on an observe side (leading end side of the rotating arm 23) of the moving arm 40. A pulley 46 is fitted on a rotating shaft of the first motor 45, and a pulley 47 opposing this pulley 46 is fitted on an outer periphery of the rotating arm 23. An endless belt 48 is wound around and trained between the respective pulleys 46 and 47, so that the rotatively driving force of the first motor 45 is transmitted as a force for rotating (arrow a) the rotating arm 23 about the axis 41. When the rotating arm 23 is rotated 180 degrees about the axis 41 by the driving of the first motor 45, the pickup head 5 mounted on the leading end portion of the rotating arm 23 is vertically inverted, thereby changing the orientation of the nozzle 24 so as to face upward or downward.

The pickup head 5 is mounted at a position spaced apart from the axis 41 of the rotating arm 23, and when face-down mounting is effected, the nozzle 24 is disposed to assume a position remoter from the mounting head 7 with respect to the axis 41 in the first direction when the nozzle 24 is in a downwardly oriented attitude (see FIGS. 2 and 5). Since the nozzle 24 and the axis 41 are in such a positional relationship, the nozzle 24 that rotates about the axis 41 by the vertical inversion of the pickup head 5 moves in the direction of approaching the mounting head 7. In consequence, when the pickup head 5 moves from the pickup position indicated by the solid lines in FIG. 5 to a delivering position indicated by dashed lines, if the pickup head 5 moves in the first direction by a distance shorter than a center distance d1 between the nozzle 24 and the nozzle 30 of the mounting head 7, it becomes possible for the pickup head 5 to deliver the face-down chip 4 to the mounting head 7. As the moving distance of the pickup head 5 is thus shortened, the time required for facedown mounting can also be shortened, thereby improving the production efficiency of the part mounting apparatus 1.

In addition, in a case where an attempt is made to improve productivity by adopting a multi-bonder in which the intermediate table 6 is disposed at a height between the wafer sheet holder 2 and the substrate supporting table 9, it becomes possible to avoid interference between the pickup head and the intermediate stage by rotating the rotating arm in the direction shown at a of FIG. 2, thereby permitting the movement of the chip in a shortest distance.

On the other hand, in a case where face-up mounting is effected, the pickup head 5 is fixed in an attitude in which the nozzle 24 faces downward, and the axis 41 is disposed so as to assume a position remoter from the intermediate table 6 with respect to the nozzle 24 in the first direction (see FIG. 6). Namely, between face-up mounting and facedown mounting, the positional relation between the nozzle 24 and the axis 41 is reverse. In the case of face-up mounting, the pickup head 5 which picked up the chip 4 at the position indicated by the solid lines in FIG. 6 moves to the position indicated by the dashed lines with its attitude intact, and places the chip 4 onto the intermediate table 6. For this reason, if the axis 41 were at a position closer to the intermediate table 6, it would be necessary to move the pickup head 5 in a route which also takes into consideration interference between the intermediate table 6 and not only the nozzle 24 but also the rotating arm 23 having the axis 41 as its central axis. However, if the nozzle 24 is at a position closer to the intermediate table 6, it suffices to take into consideration the interference of only the nozzle 24, with the result that the moving distance can be shorted. As the moving distance of the pickup head 5 is thus shortened, the time required for face-up mounting can also be shortened, thereby improving the production efficiency of the part mounting apparatus 1.

A shaft 49 extending in the second direction is inserted in a central portion of the rotating arm 23 movably in the second direction. A compression spring 50 is loaded on an outer periphery of the shaft 49 in a state in which one end of the compression spring 50 abuts against a spring stopper 51 formed on the shaft 49 and its other end abuts against a spring stopper 52 formed on the rotating arm 23. Opposite end portions of the shaft 49 respectively project from opposite ends of the rotating arm 23, and a cam follower 53 is fitted to a rear end portion of the shaft 49. An eccentric cam 54 that engages this cam follower 53 is fitted on a rotating shaft 56 of a second motor 55 mounted on a reverse side (rear end side of the rotating arm 23) of the moving arm 40. The cam follower 53 is in contact with the eccentric cam 54 in a state of being urged by the resiliency of the compression spring 50. If the second motor 55 is driven the cam follower 53 is driven by the rotation of the eccentric cam 54, and the shaft 49 connected thereto is moved in the second direction (arrow b).

The nozzle 24 mounted on the pickup head 5 is rotatable (arrow c) about an axis 57 that is in an orthogonal relation to the axis 41 of the rotating arm 23. A rotation lever 58 projecting laterally is mounted on the nozzle 24. A leading end portion of the rotation lever 58 is engaged with a pin 60 provided on a leading end portion of the shaft 49, and is adapted to rotate about the axis 57 in conjunction with the movement of the shaft 49 which is moved by the driving of the second motor 55. The nozzle 24 is rotated about the axis 57 by the rotation of the rotation lever 58. Since the second motor 55 serving as the rotatively driving source for the nozzle 24 is disposed not on the pickup head 5 but on the moving arm 40, the pickup head 5 is made compact and lightweight. In addition, there is no wiring for power supply.

In addition, since the mechanism related to the inversion of the pickup head 5 and the mechanism related to the rotation of the nozzle 24 are independent of each other and do not interfere with each other, it is possible to rotate the nozzle 24 during the inversion of the pickup head 5, and productivity can be improved by simultaneously executing these two operations.

A ventilation path 59 is formed in the interior of the shaft 49. This ventilation path 59 communicates with an opening 61 formed in the leading end portion of the shaft 49, and is connected to the nozzle 24 through an un-illustrated pipe. This ventilation path 59 is connected to an vacuum generating source and a compressed air generating source (neither are shown) on the rear end side of the shaft 49 through an un-illustrated changeover valve, whereby the nozzle 24 can be set in a vacuum state at the time of sucking the chip 4, and the suction can be canceled by effecting a vacuum break for the chip 4 being sucked, by increasing the internal pressure of the nozzle 24 in the vacuum state.

In the part mounting apparatus 1 in accordance with the embodiment of the invention, the wafer sheet 3 forms a part supplying stage for supplying the chip 4 adhered to the upper surface to the pickup head 5; the intermediate table 6 forms a intermediate stage for temporarily placing thereon the chip 4 picked up by the pickup head 5 and for delivering it to the mounting head 7; and the substrate supporting table 9 forms a mounting stage for mounting on the substrate 8 the chip 4 received by the mounting head 7.

The nozzle 24 is one form of a pickup tool for picking up the chip 4 (part) by vacuum suction. As the pickup tool, it is possible to use one which picks up the chip 4 by a mechanical unit, an electromagnetic unit, or the like insofar as it is capable of holding the chip 4 for a fixed time duration and effecting a changeover between pickup and release.

The moving arm 40 is one form of a pickup head supporting unit for supporting the pickup head. The pickup head supporting unit may be one which does not move with its position fixed as in the case of the moving arm 40, insofar as it is capable of invertably supporting the pickup head 5.

The first motor 45 is one form of a pickup head inverting unit for vertically inverting the pickup head with respect to the pickup head supporting unit. The second motor 55 is one form of a driving force generating unit constituting a pickup tool rotating unit for rotating the pickup tool about its rotational axis.

The shaft 49 and the rotation lever 58 are one form of a driving force transmitting unit for transmitting the driving force of the driving force generating unit as a rotational force of the pickup tool. The rotation lever 58 is one form of an engaged portion that is engaged with another end portion (leading end portion) of the shaft 49.

The present invention is useful as a part mounting apparatus for mounting onto a substrate a part delivered between plural heads.

What is claimed is:

1. A part mounting apparatus comprising:
a pickup head having a pickup tool for picking up a part;
a pickup head supporting unit supporting the pickup head;
a pickup head supporting arm having one end portion where the pickup head is disposed and an other end portion rotatably mounted to the pickup head supporting unit;
a pickup head inverting unit vertically inverting the pickup head with respect to the pickup head supporting unit;
a pickup tool rotating unit rotating the pickup tool about a rotational axis of the pickup tool; and
a shaft disposed on the pickup head supporting arm so as to be movable in a direction of the rotational axis, both end portions of the shaft respectively projecting from the both end portions of the pickup head supporting arm,
wherein the pickup tool rotating unit includes a driving force generating unit and a driving force transmitting unit transmitting a driving force of the driving force generating unit as a rotational force of the pickup tool; and
the driving force generating unit is disposed on the pickup head supporting unit,
wherein the driving force generating unit imparts a force for moving in the direction of the rotational axis of the pickup head supporting arm from one end portion of the shaft to the shaft; and
the driving force transmitting unit converts the translatory movement of an other end portion of the shaft into rotary movement of the pickup tool,
wherein the driving force generating unit causes a driven member disposed at one end portion of the shaft to follow rotary movement of an eccentric cam disposed on the pickup head supporting unit so as to impart to the shaft a force for moving in the direction of the rotational axis of the pickup head supporting arm.

2. A part mounting apparatus comprising:
a pickup head having a pickup tool for picking up a part;
a pickup head supporting unit supporting the pickup head;
a pickup head supporting arm having one end portion where the pickup head is disposed and an other end portion rotatably mounted to the pickup head supporting unit;
a pickup head inverting unit vertically inverting the pickup head with respect to the pickup head supporting unit;
a pickup tool rotating unit rotating the pickup tool about a rotational axis of the pickup tool; and
a shaft disposed on the pickup head supporting arm so as to be movable in a direction of the rotational axis, both end portions of the shaft respectively projecting from the both end portions of the pickup head supporting arm, wherein the pickup tool rotating unit includes a driving force generating unit and a driving force transmitting unit transmitting a driving force of the driving force generating unit as a rotational force of the pickup tool; and the driving force generating unit is disposed on the pickup head supporting unit, wherein the driving force generating unit imparts a force for moving in the direction of the rotational axis of the pickup head supporting arm from one end portion of the shaft to the shaft; and the driving force transmitting unit converts the translatory movement of an other end portion of the shaft into rotary movement of the pickup tool, wherein the pickup tool has an engaged portion that is engaged with another end portion of the shaft; and the engaged portion is moved in conjunction with the translatory movement of the other end portion of the shaft such that the translatory movement of the other end portion of the shaft is converted into the rotary movement of the pickup tool.

3. A part mounting apparatus comprising:

a pickup head having a pickup tool for picking up a part;

a pickup head supporting unit supporting the pickup head;

a pickup head supporting arm having one end portion where the pickup head is disposed and an other end portion rotatably mounted to the pickup head supporting unit;

a pickup head inverting unit vertically inverting the pickup head with respect to the pickup head supporting unit;

a pickup tool rotating unit rotating the pickup tool about a rotational axis of the pickup tool; and a mounting head receiving the part inverted in conjunction with the inversion of the pickup head and mounting the part onto a substrate, wherein the pickup tool rotating unit includes a driving force generating unit and a driving force transmitting unit transmitting a driving force of the driving force generating unit as a rotational force of the pickup tool; and the driving force generating unit is disposed on the pickup head supporting unit, wherein the pickup head is supported by the pickup head supporting arm such that the pickup tool is located at a position remoter from the mounting head with respect to the rotational axis of the pickup head supporting arm when the pickup head is in a downwardly oriented attitude, and wherein the pickup tool rotating unit includes the driving force generating unit disposed on the pickup head supporting unit and the driving force transmitting unit disposed on the pickup head supporting arm and adapted to transmit the driving force of the driving force generating unit as the rotational force of the pickup tool.

4. A part mounting apparatus comprising:

a pickup head having a pickup tool for picking up a part;

a pickup head supporting unit supporting the pickup head;

a pickup head supporting arm having one end portion where the pickup head is disposed and an other end portion rotatably mounted to the pickup head supporting unit;

a pickup head inverting unit vertically inverting the pickup head with respect to the pickup head supporting unit;

a pickup tool rotating unit rotating the pickup tool about a rotational axis of the pickup tool;

a part supplying stage;

an intermediate stage temporarily placing the picked up part;

a mounting head receiving the part inverted in conjunction with the inversion of the pickup head or a part placed temporarily without being inverted on the intermediate stage; and a mounting stage mounting onto a substrate the part received by the mounting head;

wherein the pickup tool rotating unit includes a driving force generating unit and a driving force transmitting unit transmitting a driving force of the driving force generating unit as a rotational force of the pickup tool; and the driving force generating unit is disposed on the pickup head supporting unit, wherein, when the mounting head receives the part placed temporarily on the intermediate stage without being inverted and mounts the part onto the substrate, the pickup head is disposed such that the rotational axis of the pickup head supporting arm is located at a position remoter from the intermediate stage with respect to the pickup tool, and wherein when the mounting head receives the part inverted in conjunction with the inversion of the pickup head and mounts the part onto the substrate, the pickup head is disposed such that the pickup tool assumes a position remoter from the mounting head with respect to the rotational axis of the pickup head supporting arm when the pickup head is in a downwardly oriented attitude.

* * * * *